United States Patent
Ahmed et al.

(10) Patent No.: US 6,538,947 B2
(45) Date of Patent: Mar. 25, 2003

(54) METHOD FOR MULTIPLE MATCH DETECTION IN CONTENT ADDRESSABLE MEMORIES

(75) Inventors: Abdullah Ahmed, Scarborough (CA); Valerie L. Lines, Ottawa (CA)

(73) Assignee: Mosaid Technologies Incorporated, Kanata (*) Notice: Subject to any disclaimer, the term of this patent is extended or adjusted under 35 U.S.C. 154(b) by 0 days.

(21) Appl. No.: 09/960,364

(22) Filed: Sep. 24, 2001

(65) Prior Publication Data

US 2002/0009009 A1 Jan. 24, 2002

Related U.S. Application Data

(63) Continuation of application No. 09/563,066, filed on Apr. 24, 2000, now Pat. No. 6,307,798.

(30) Foreign Application Priority Data

Jul. 12, 1999 (CA) .......................................... 2,277,717

(51) Int. Cl.[7] ................................................ G11C 7/00
(52) U.S. Cl. ........................ 365/207; 365/49; 365/205; 365/203; 365/202; 365/189.07; 365/196; 365/210
(58) Field of Search ...................... 365/189.01, 189.07, 365/196, 49, 202, 203, 205, 207, 210

(56) References Cited

U.S. PATENT DOCUMENTS

| | | | |
|---|---|---|---|
| 6,195,277 B1 | * | 2/2001 | Sywyk et al. .................. 365/99 |
| 6,307,798 B1 | * | 10/2001 | Ahmed et al. ............... 365/207 |
| 2001/0026464 A1 | * | 10/2001 | Hata et al. ..................... 365/49 |
| 2002/0009009 A1 | * | 1/2002 | Ahmed et al. ............... 365/207 |

* cited by examiner

Primary Examiner—Viet Q. Nguyen
(74) Attorney, Agent, or Firm—Borden Ladner Gervais LLP; Leslie Anne Kinsman

(57) ABSTRACT

A method for detecting n match conditions within a CAM array. The method consists of precharging a sense node and a reference node of a differential amplifier in an inactive state to a supply voltage level. The reference node voltage level is then changed to a reference voltage level between a voltage level corresponding to n match condition signals and n−1 match condition signals by turning on a reference device, The sense node voltage level is changed to a voltage level corresponding to a number of match condition signals by turning on a corresponding number of matchline devices, and the reference voltage level is compared to the voltage level corresponding to the number of match condition signals by switching the differential amplifier to an active state. An output signal corresponding to the result of the comparison is then provided from the differential amplifier. The method can further include a step of switching the differential amplifier to the inactive state when the output signal is provided.

6 Claims, 9 Drawing Sheets

METHOD FOR MULTIPLE MATCH DETECTION IN CONTENT ADDRESSABLE MEMORIES

This application is a continuation of U.S. application Ser. No. 09/563,066 filed Apr. 24, 2000, now U.S. Pat. No. 6,307,798.

FIELD OF THE INVENTION

The present invention generally relates to semiconductor memory devices and more specifically to detecting multiple matches between search and stored data in memory systems such as high-density Content Addressable Mermory (CAM).

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. As the amount of memory increases the number of bits per instruction needed to reference a memory cell also increases. This diminishes the efficiency of the system. In addition to this drawback, standard memory systems are not well designed for a content based search. Content based searches in standard memory require a software based algorithmic search under the control of the microprocessor. These searches are neither quick nor efficient in using processor resources.

To overcome these inadequacies an associative memory system called Content Addressable Memory (CAM) has been developed. CAM allows cells to be referenced by their contents, so it first found use in lookup table implementations such as cache memory subsystems and is now rapidly finding use in networking systems. CAM's most valuable feature is its ability to perform a search and compare as a single operation. Specified user data and stored data can be compared and match and mismatch results can be returned by allowing the contents of a comparand register to be compared directly with all addresses held in a given memory system's address space simultaneously.

In addition to the rows and columns of memory cells, that are common to most memory systems, CAM also has a matchline and a matchline detection circuit (DTC). The DTC is a sense amplifier that senses the changes in the logic state of a matchline for the cells in that row. The DTC detects a match or a mismatch during a CAM search and compare operation. Though in many early applications it was not a concern, presently the detection of multiple matches on a matchline is of great interest. Distinguishing between a match and mismatch condition is as simple as declaring a threshold voltage or current level between the match and mismatch levels, and determining on which side of the threshold the matchline level was. This cannot be done with the presence of multiple matches, as the effect that it has is simply to increase the decay rate of the voltage or current level.

In a typical CAM system, various memory cells, arranged in a row, are connected by a matchline to a detection circuit (DTC). Running orthogonal to the matchlines are search lines that carry loaded search data to compare with stored data in the columns of CAM cells. Typically, matchlines are precharged to a matchline precharge voltage, for example, VDD. If a search result is a match, i.e. search data on the search line matches stored data in the CAM cell, then there is no change in the matchline voltage level, i.e. it remains at its precharge state, VDD. In the case of a mismatch, a direct current path is established between the respective matchline and VSS via the CAM cell and the voltage level on that matchline begins to decrease. This voltage drop is then detected by the respective DTC. Thus to detect a mismatch, each DTC, associated with each matchline, must detect whether a differing voltage level develops as a result of the search and compare operation. However, it is advantageous to determine whether a detected match has resulted from a single row or from multiple rows.

In order to detect multiple matches, otherwise referred to as hits, the problem encountered is one of detecting different voltage levels that can develop on a line. U.S. Pat. No. 5,012,448 to Matsuoka et al. describes a method for detecting a voltage level in a multilevel read only memory (ROM) cell. As shown in FIG. 1, the method and apparatus described therein use a pair of CMOS inverters that are operated as small signal amplifiers with an NMOS device used for current sensing. Both reference and active side sources are also fed into a current mirror. Though this design accomplishes the desired task of multilevel sensing, it does so at the cost of increased heat dissipation, and a limited output voltage swing. This increase in heat is a direct result of high power consumption by the discrete components and is a limiting factor in the attempt to shrink the component size so that it occupies less circuit area.

U.S. Pat. No. 5,446,686 to Bosnyak et al. describes a method and an apparatus for detecting multiple address matches in a CAM. The described apparatus, as shown in FIGS. 2a, 2b and 2c uses a pair of 'hit' and 'dhit' lines that are connected to the power supply terminal (VDD) through a pair of pull-up PMOS transistors. A set of NMOS devices N0–N3 on the 'hit' line operate in saturation since the voltages across the drain and source terminals are always above a threshold compared to the gate-to-source voltage (Vgs) of these devices. The reference transistor has a width to length ratio that is 1.5 times in dimension relative to any one of the NMOS devices N0–N3 to provide a 1.5 times saturation current. The reference transistor Nref also operates in its saturation region. The Vgs of the Nref device is generated using a rather complex reference circuit to ensure appropriate compensation for temperature and voltage characteristics. Furthermore, the described apparatus uses a comparator to compare the current difference generated on the 'hit' and 'dhit' lines for a single and multiple match generation. The comparator is a two-stage area-intensive component that uses bipolar transistors and resistors for achieving the desired output.

One limitation of this application is as follows. In order to operate the NMOS devices N0–N3 and Nref in saturation, the pull-up PMOS devices connecting the 'hit' and 'dhit' lines to the power supply terminal have to have relatively low resistivity such that the voltage drop is not significant across them while the devices N0–N3 and Nref turn on during sensing. This is required to ensure that the voltage across the drain-to-source channel does not change significantly. This is achieved at the cost of relatively high current consumption through the 'hit' and 'dhit' lines during the entire operation, which presents a limitation for multiple-match detection within high density CAMs.

Furthermore, to operate Nref in saturation, a relatively complex compensating reference circuit is required to ensure compensation for temperature and voltage fluctuations in order to develop a constant reference current. The comparator itself is area consuming and consumes constant current. The requirement of bipolar devices presents a limitation for use in dynamic random access memories (DRAM), which are entirely CMOS based.

In conclusion, the increased demand for large memory systems, and the desire to efficiently use these systems for more than simple sequential access makes it desirable to provide a multilevel sense detection method that in an ideal embodiment combines fast sensing with low power consumption.

SUMMARY OF THE INVENTION

It is an object of the present invention to provide a match detection method that obviates or mitigates at least one disadvantage of prior match detection methods. It is a particular object to provide a multilevel sense detection method that is both fast and consumes less power than previously known signal detection circuits.

In accordance with a first aspect of the present invention, there is provided a method for detecting n match conditions within a CAM array. The method consists of precharging a sense node and a reference node of a differential amplifier in an inactive state to a supply voltage level. The voltage level of the reference node is then changed to a reference voltage level in a predetermined voltage range by turning on a reference device. The voltage level of the sense node is then changed to a sensed voltage level dependent on a number of match condition signals by turning on a corresponding number of matchline devices coupled in parallel to the sense node, and the reference voltage level is compared to the sensed voltage level by switching the differential amplifier to an active state. An output signal corresponding to the result of the comparison is then provided from the differential amplifier. The method can further include a step of switching the differential amplifier to the inactive state when the output signal is provided, and latching the output signal.

In a presently preferred embodiment of the method of the present invention, the reference node voltage level and the sense node voltage level start changing from the supply voltage level at about the same time. The differential amplifier is switched to the active state at a predetermined time delay after the reference node voltage level and the sense node voltage level start changing.

In yet another preferred embodiment of the method of the present invention, the predetermined voltage range is between a voltage level corresponding to n match condition signals and n−1 match condition signals.

BRIEF DESCRIPTION OF THE DRAWINGS

Exemplary embodiments of the invention will now be further described with references to the drawings in which same reference numerals designate similar parts throughout the figures thereof, and wherein.

DETAILED DESCRIPTION

Figure 1:
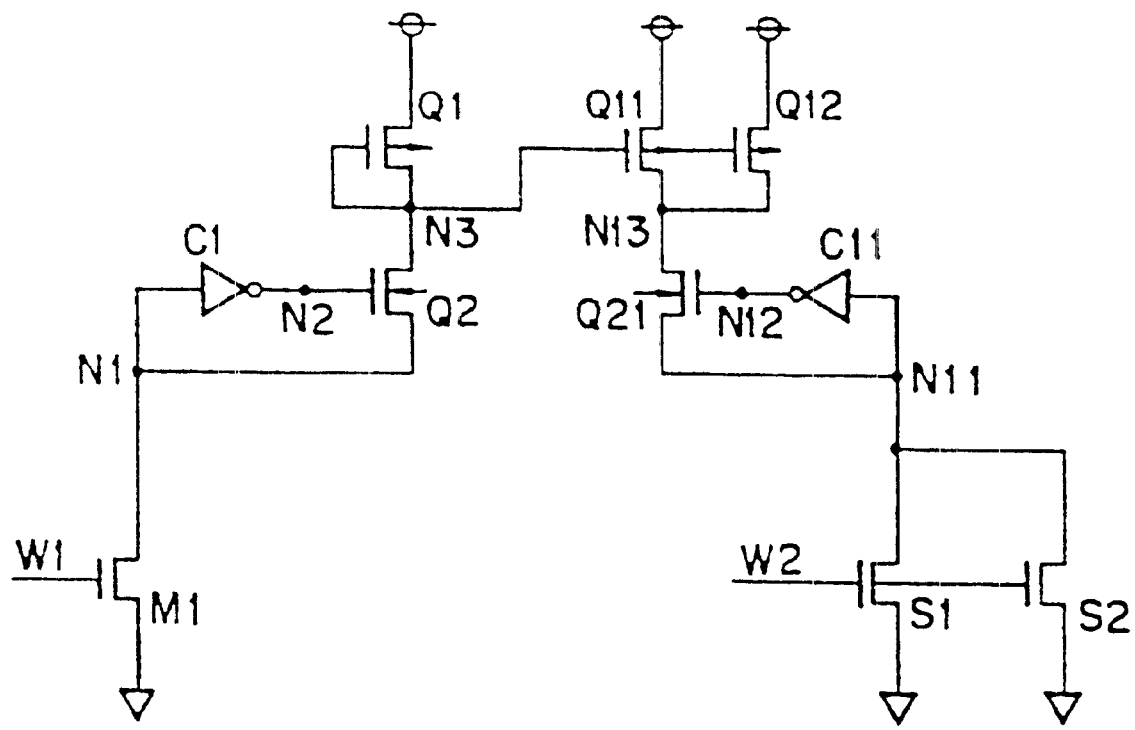
FIG. 1 shows a conventional sense amplifier for a multilevel sensing.
Figures 2A, 2B:
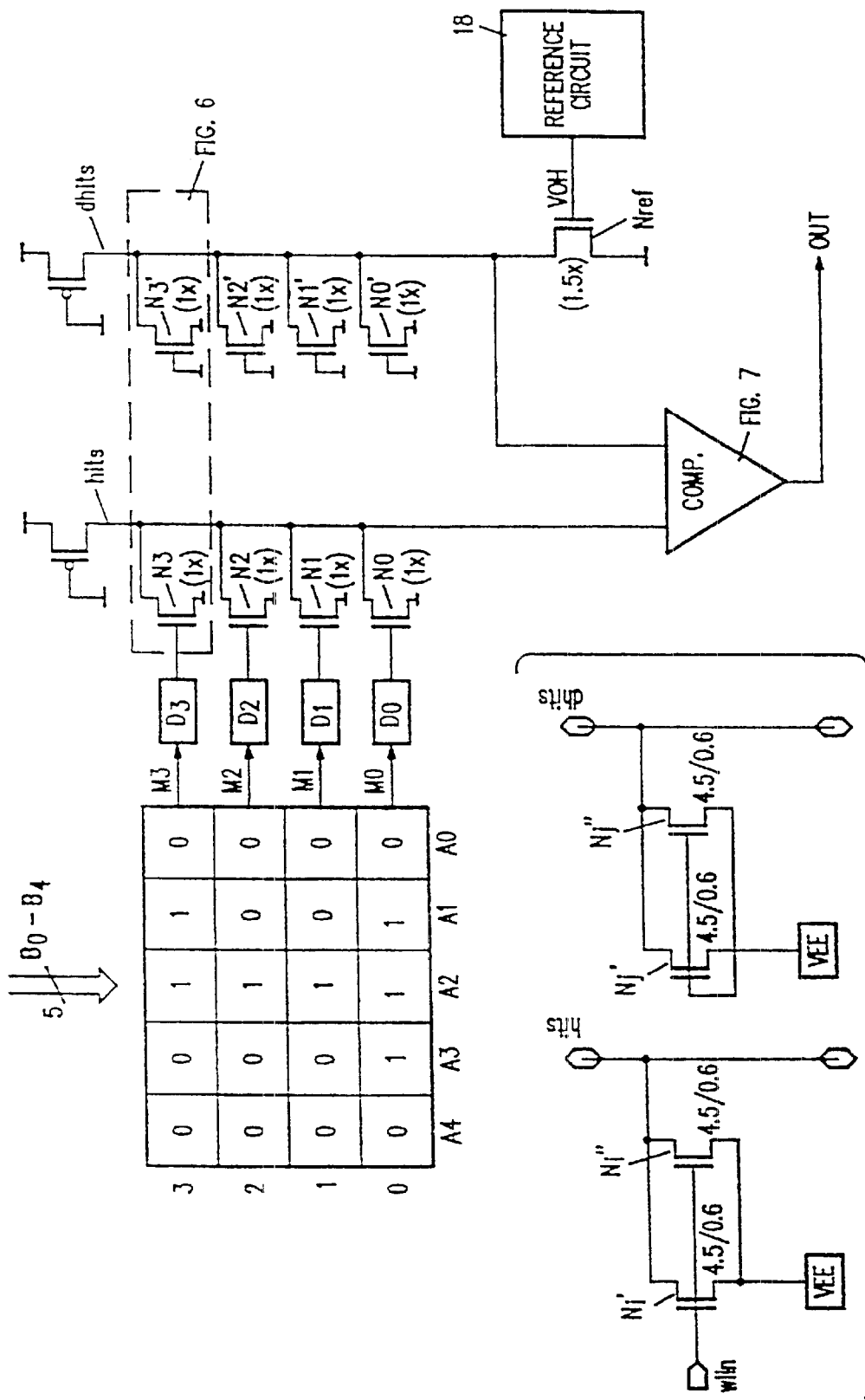
FIGS. 2a, 2b and 2c show a prior art apparatus for detecting multiple address matches in a CAM.
Figure 2C:
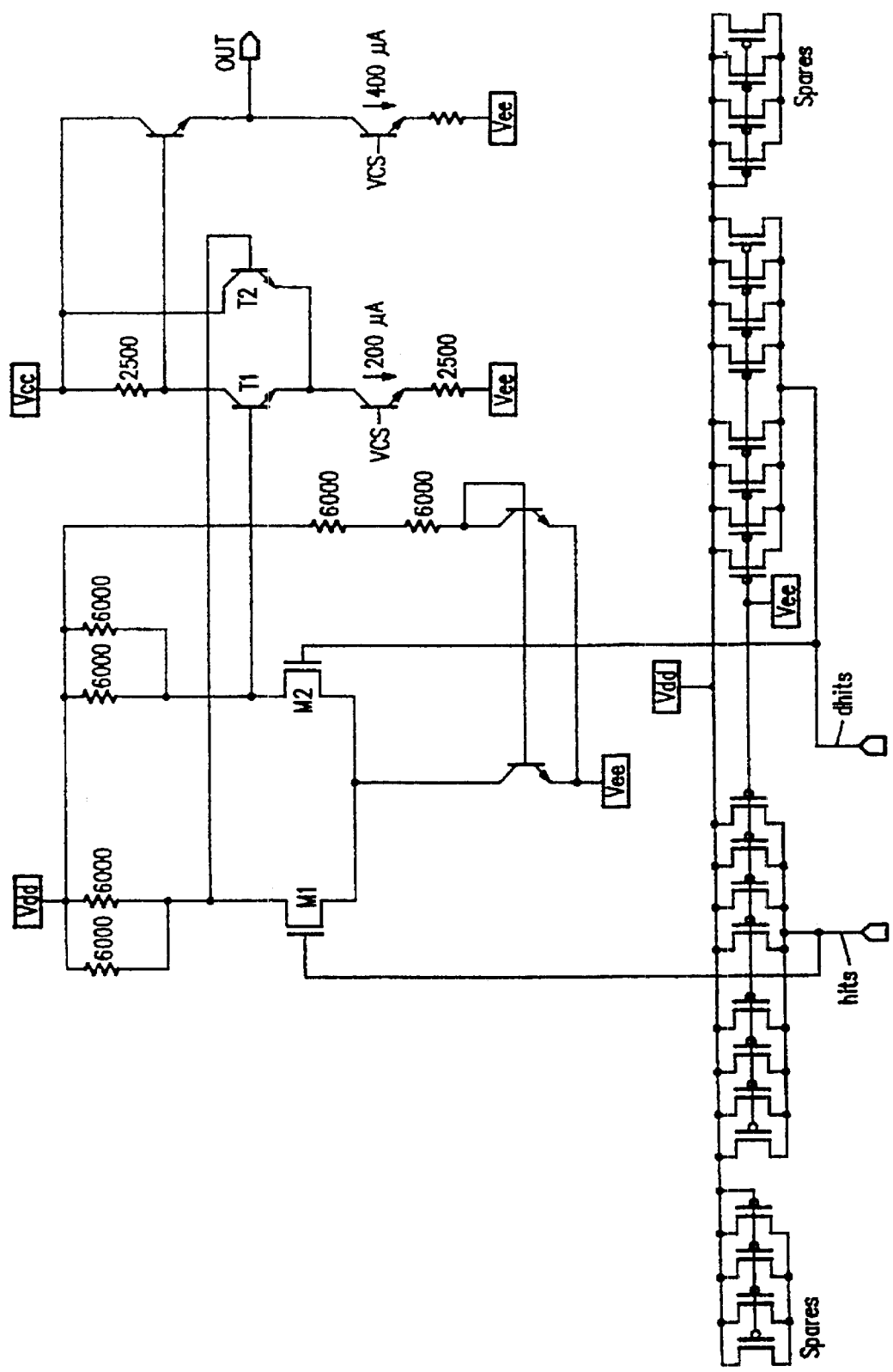
Figure 3:
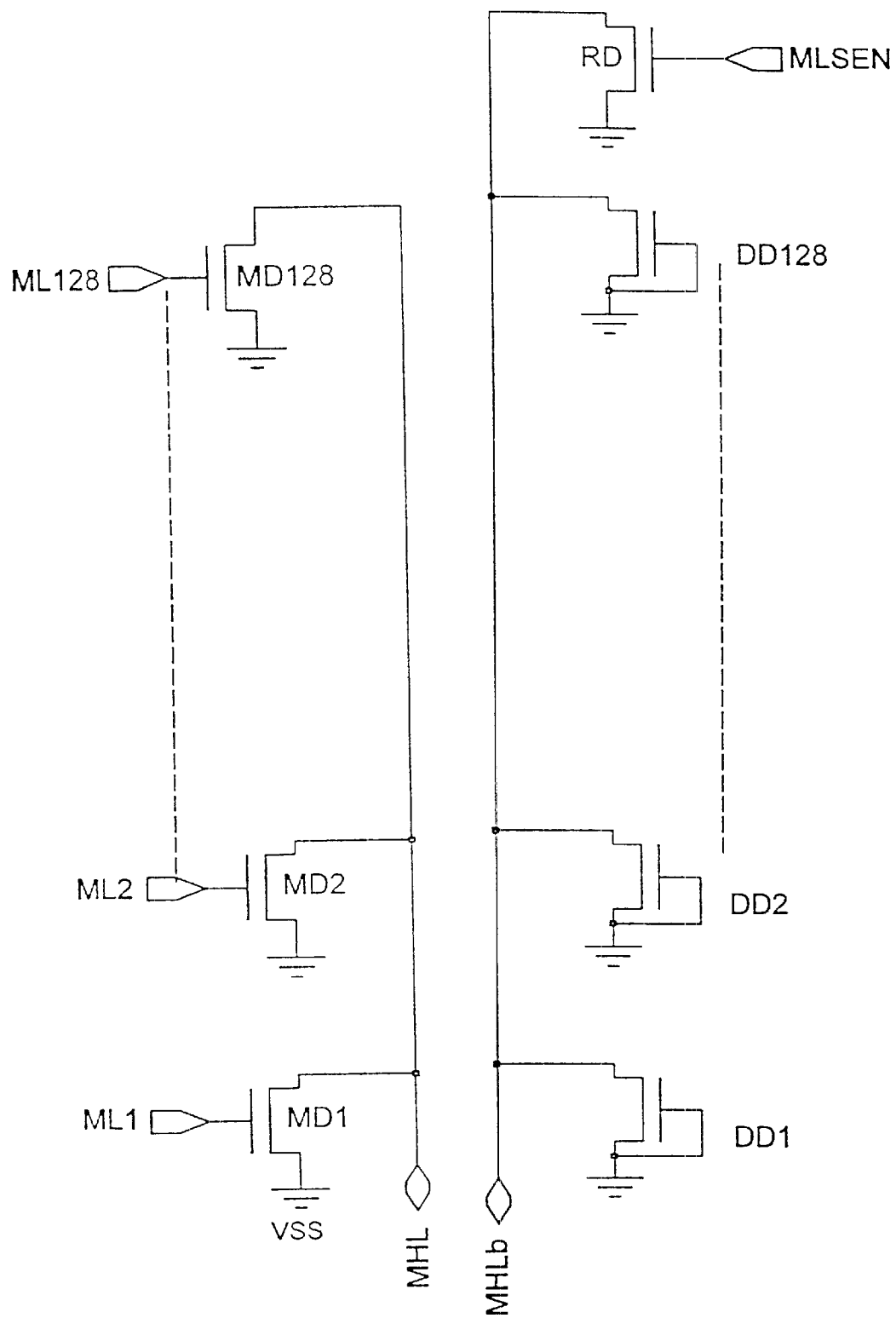
FIG. 3 is a schematic diagram illustrating the structure of a multiple-hit-line to be sensed and a reference multiple-hit-line; as part of an embodiment of this invention.

FIG. 3 illustrates the structure of a multiple hit line MHL and a reference line MHLb as part of one embodiment of the present invention. The multiple hit line MHL is coupled to a number (128 in this embodiment) of matchlines ML1–ML128, in parallel, via NMOS matchline devices MD1–MD128, which all have similar dimensions and operating characteristics. Each of these matchline devices MD1–MD128 is setup so that its source is connected to VSS, its drain is connected to MHL, and its gate is connected to the respective matchline thereby allowing the voltage level on MHL to be controlled by the multiple pull-down paths provided by the matchline devices MD1–MD128. The number of matchline devices used in an array of CAM cells is equal to the number of rows of CAM cells in that array, which in this embodiment is 128. In turn, each matchline is connected to a row of CAM cells, which use the matchline to report the incidence of a hit (or a match) and a miss (or a mismatch).

In the above structure, each of the matchlines ML1–ML128 carries match or mismatch information about the cells in its row. In the event of a mismatch between search data and stored data in a CAM cell in a selected row, the corresponding matchline is pulled down to VSS (low), from a precharged state of VDD (high) by a corresponding matchline sense amplifier (not shown) whereas a match between search and stored data will result in that matchline remaining at the precharged VDD level. As long as at least one matchline is at the high level, MHL will be discharged towards VSS through at least one matchline device. Having more than one matchline reporting a hit (i.e. remaining at VDD) results in MHL discharging towards VSS faster. In the event that no matchline reports a hit, MHL remains at VDD because all the matchlines are low and none of the matchline devices turn on. The purpose of this embodiment is to distinguish a multiple hit condition from a non-multiple hit condition where only one or no match occurs on MHL.

The second line used by this embodiment is a reference line denoted by MHLb. This reference line has an equal number (128 in this embodiment) of NMOS dummy devices DD1–DD128 as the number of matchline devices MD1–MD128, connected in a similar parallel manner, except that the gates are connected to the VSS line rather than the actual matchlines ML1–ML128, thereby each dummy device simulating a mismatch condition. These dummy devices DD1–DD128 are chosen so as to have electrical characteristics similar to the matchline devices MD1–MD128 for this purpose, and thus provide the same parasitic capacitance and resistive loading on MHLb as is present on MHL for noise reduction. As a result, any voltage or temperature variations will affect both MHL and MHLb lines equally, and there is no need for a voltage and temperature compensation using a reference generator or similar circuits for addressing this problem. In addition, there is an NMOS reference device RD on MHLb whose channel width falls between one and two times (in this embodiment 3/2) the channel width of any one of the matchline devices MD1–MD128. The gate of this reference device RD is connected to a matchline sense enable signal MLSEN which also activates the matchline sense amplifiers (not shown) each of which senses and latches relevant matchline data on its corresponding matchline. Match data is established on the matchlines ML1–ML128 within a very short time after MLSEN is driven to VDD. Subsequently, in case of a match, one of the gates of the matchline devices MD1–MD128 will be driven to VDD at approximately the same time the gate of the reference device RD is driven to VDD by MLSEN. The timing signal MLSEN is used to ensure that both MHL and MHLb start to change their voltages almost simultaneously. This allows for the current through MHL and MHLb to be controlled and limited, as opposed to the prior art solutions, wherein a constant current is continuously drawn.

Figure 4:
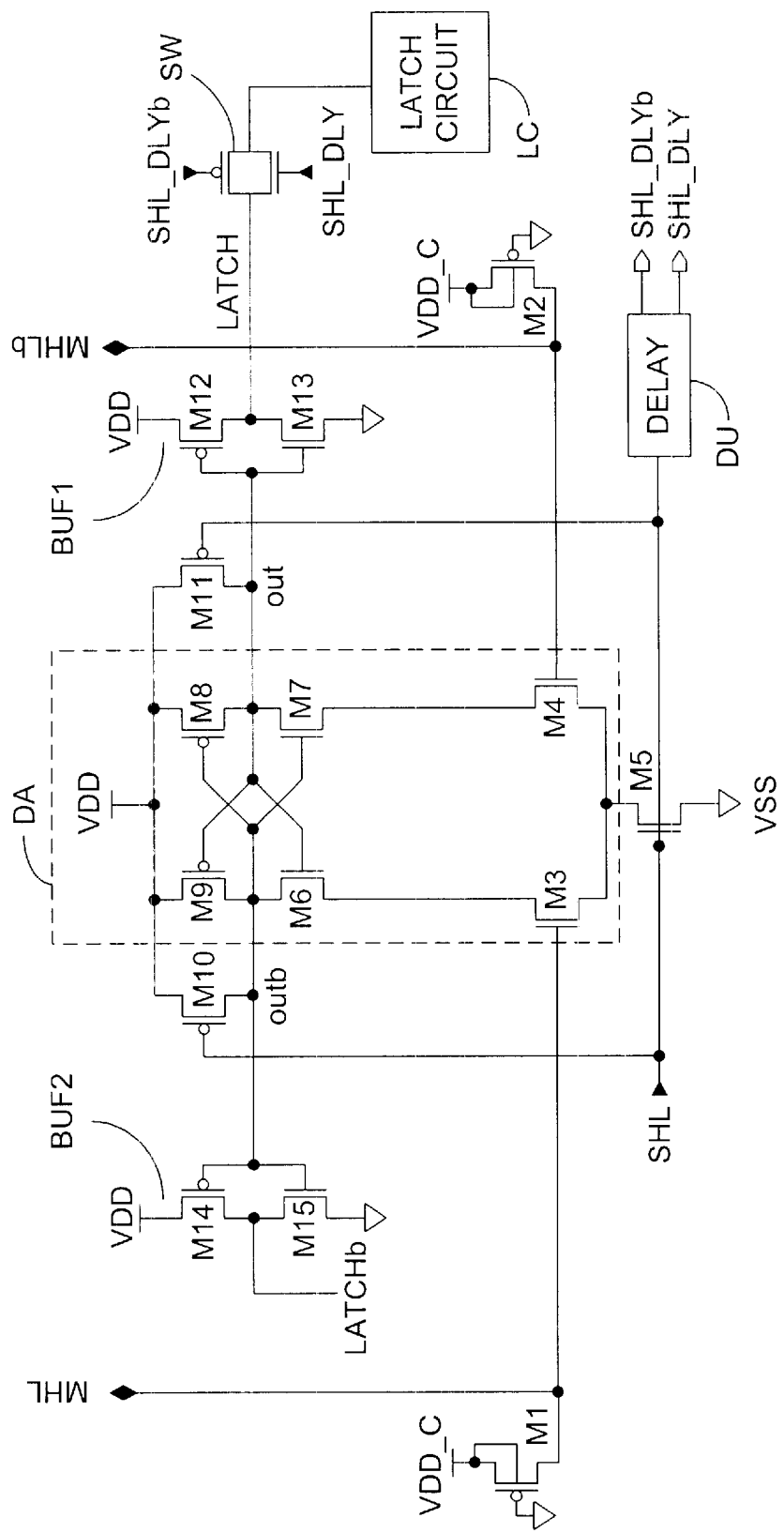
FIG. 4 is a schematic diagram illustrating a differential amplifier and associated circuits for use with the structure shown in FIG. 3, as a first embodiment of the present invention.

In this first embodiment, MHL and MHLb are both clamped to VDD using two PMOS voltage clamping devices, shown in FIG. 4 as M1 and M2. For a single hit, MHL will be pulled down, after a brief settling time, by the matchline that indicates the hit to a voltage level slightly higher than MHLb. This is due to the fact that the matchline device that indicates the single hit will be on simultaneously with the clamping device M1 thereby setting up a voltage divider. Since the width of the reference device RD is 3/2 times the width of any of the matchline devices MD1–MD128, MHLb will be driven lower than MHL. In the case of two or more hits (matches), MHL will reach a voltage level lower than that of MHLb, after the brief settling time, since the combined width of the matchline devices whose gates are at VDD is larger than that of the reference device RD. For the case of no matches in the array, the gates of all the matchline devices MD1–MD128 are at VSS, thus MHL will stay at the precharged level while MHLb is driven to a lower voltage.

FIG. 4 shows a differential amplifier DA and associated circuits used with the structure shown in FIG. 3 as a first embodiment of this invention. As indicated above, the PMOS clamping devices M1 and M2 are used for clamping MHL and MHLb to VDD. The gates of M1 and M2 are connected to VSS making both devices conduct as soon as the voltage level on MHL and MHLb drops below VDD-Vtp (the threshold voltage of a PMOS device). The source terminals of M1 and M2 are connected to VDD and the drain terminal of M1 is connected to MHL while the drain of M2 is connected to MHLb. The sizes of both M1 and M2 are so chosen as to provide enough current to clamp MHL and MHLb to VDD but M1 and M2 should have such a size as not to allow MHL and MHLb to reach a voltage level below Vtn, the threshold voltage of NMOS first and second sensing devices M3 and M4 used as part of the differential amplifier DA. With this configuration, each combination of a PMOS device (M1 or M2) with at least one NMOS device (MD1–MD128 or RD, DD1–DD128, respectively) provide a resistive voltage divider that develops the respective voltage levels on both MHL and MHLb to be detected by the differential amplifier DA. In order to achieve this voltage divider configuration the PMOS devices are relatively small thereby reducing the current flow therethrough. The ratio of transistor sizes (channel widths) of M1 and any of the matchline devices MD1–MD128 shown in FIG. 3, determines the voltage level to which MHL will get discharged when a match occurs. Similarly, the ratio of transistor sizes of M2 and RD determines the voltage level MHLb will reach when RD turns on. These ratios are typically insensitive to temperature variations thus eliminating the need for specific measures for temperature compensation.

A latching circuit of four latch transistor devices M6–M9 together with a pair of sensing devices M3 and M4 form the latching differential amplifier DA for sensing the level difference developed between MHL and MHLb. An activation circuit that switches the differential amplifier DA between an inactive phase and an active phase is formed by three activation transistor devices M5, M10 and M11, the gates of which are connected together to an activation signal SHL. The inactive phase coincides with SHL being low and the MHL and MHLb being precharged to VDD, wherets the active phase coincides with SHL being high and MHL and MHLb being sensed. SHL is turned high after MLSEN is tamed high by a specific time delay sufficient to allow the voltage difference between MHL and MHLb to reach a level detectable by the differential amplifier DA. This is to avoid DA responding to spurious voltages while MHL and MHLb are discharging towards their respective target levels. It is to be noted that even during the active phase, the differential amplifier DA being of a latching type draws current only during the switching of the latching circuit M6–M9, and that such switching occurs rather rapidly due to the positive feedback connections within the CMOS latching circuit M6–M9.

The circuit of FIG. 4 also includes an additional conventional output latch circuit LC driven by the LATCH signal through a switch SW which is turned on and off by a delay unit DU in response to the SHL signal. The delay unit provides two control signals SHL_DLY and SHL_DLYb which are time delayed versions of SHL. When SHL goes to a low voltage level the path to the latch circuit LC through the switch SW is disabled, while a high voltage level MSHL enables the latch circuit.

Figure 6:
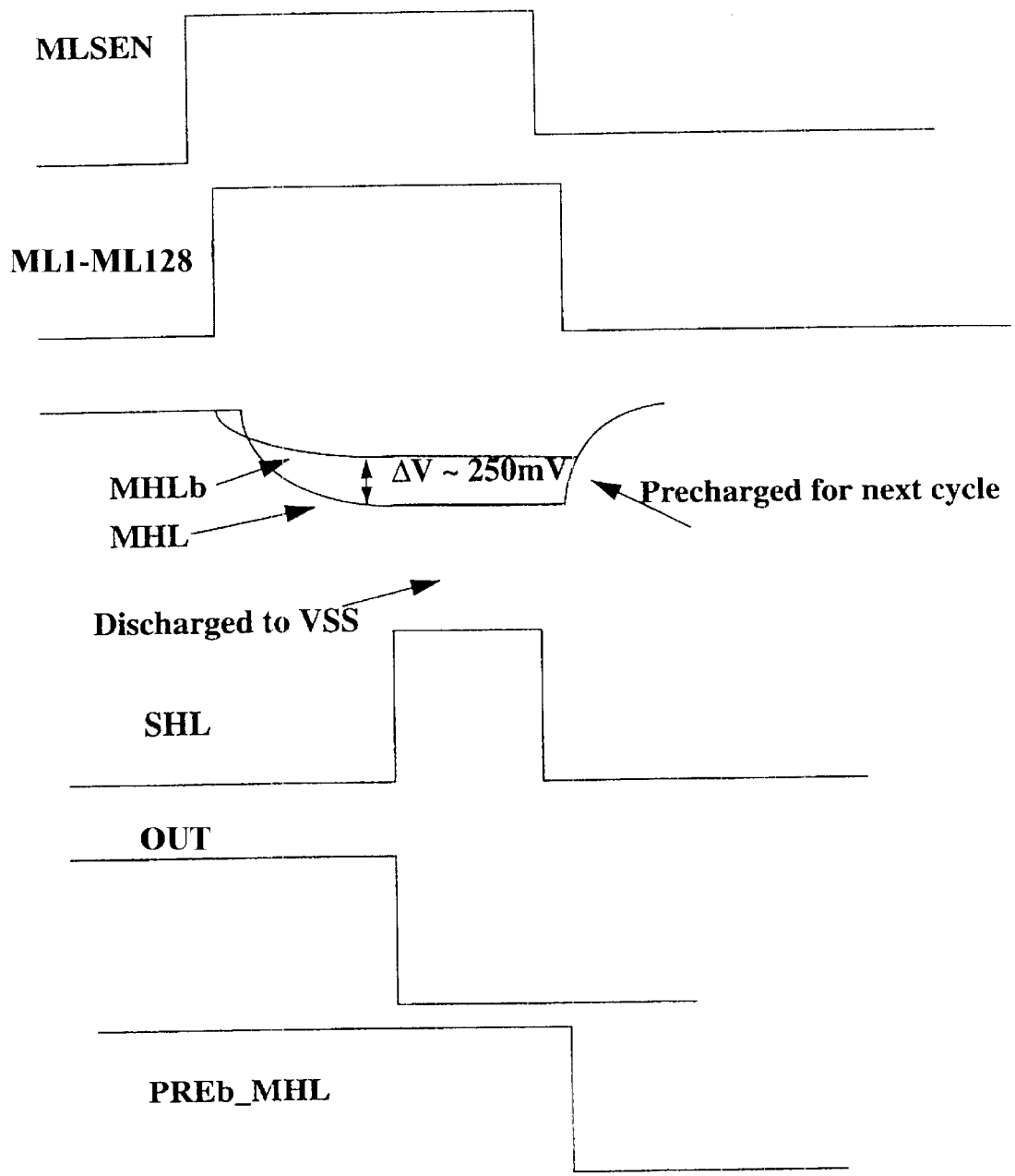
FIG. 6 is a timing diagram of the multiple match detection operation performed by the first embodiment.

FIG. 6 illustrates the relative timing sequence of the detection operation performed by the first embodiment combining the circuits of FIGS. 3 and 4. During the inactive phase when SHL is at VSS, first and second output nodes of the differential amplifier out and outb respectively, are both precharged to VDD by M10 and M11. SHL is driven to VDD to switch the differential amplifier DA into the active phase at the time when both MHL and MHLb have reached their respective voltage levels as determined by the match data on the matchlines ML1–ML128 which ensure sufficient differential sensing margin. After this predetermined delay, SHL goes to VDD and M5 turns on with its gate driven to VDD. In the case of a multiple hit, MHL settles to a lower voltage than MHLb, and the first sensing device M3 being driven by MHL is turned on slightly while the second sensing device M4 being driven by MHLb is turned on strongly. This provides a higher switching current through M4 and M7 which are connected together in series, and a lower current through M3 and M6 which are also connected together in senes. The resulting differential current in the two paths rapidly switches, i.e., flips the latching circuit due to the positive feedback between four latch transistors M6—M9. As a result, the first output node out is driven to VSS while the second output node outb stays high. Two pairs of output buffer transistor devices M12, M13 and M14, M15 provide first and second inverting buffers BUF1 and BUF2, respectively between the first and second output nodes out and outb, producing first and second respective output signals LATCH and LATCHb to be used in subsequent signal processing. In the case of a single match or no match, MHL is at a higher voltage level than MHLb, causing the first sensing transistor M3 to turn on harder than the second sensing transistor M4. A differential current is generated in an opposite manner as the second output node outb is driven down to VSS while the first output node out stays high. The first output node out drives the first inverting buffer BUF1 to provide the first output signal LATCH, which holds the information for further processing. It should be noted that the activation signal SHL remains at VDD only for the time duration it takes the sensed data to drive the latching circuit M6–M9 (active phase). Since the first output node out provides the information on multiple hits in a relatively short time, current consumption through M1 and M2 is also for a relatively short time. This is clearly shown in FIG. 6, which illustrates the timing of a multiple-hit detection operation. As a result, the current flowing through the differential amplifier DA is only present during the switching of the latching circuit M6–M9.

Figure 5:
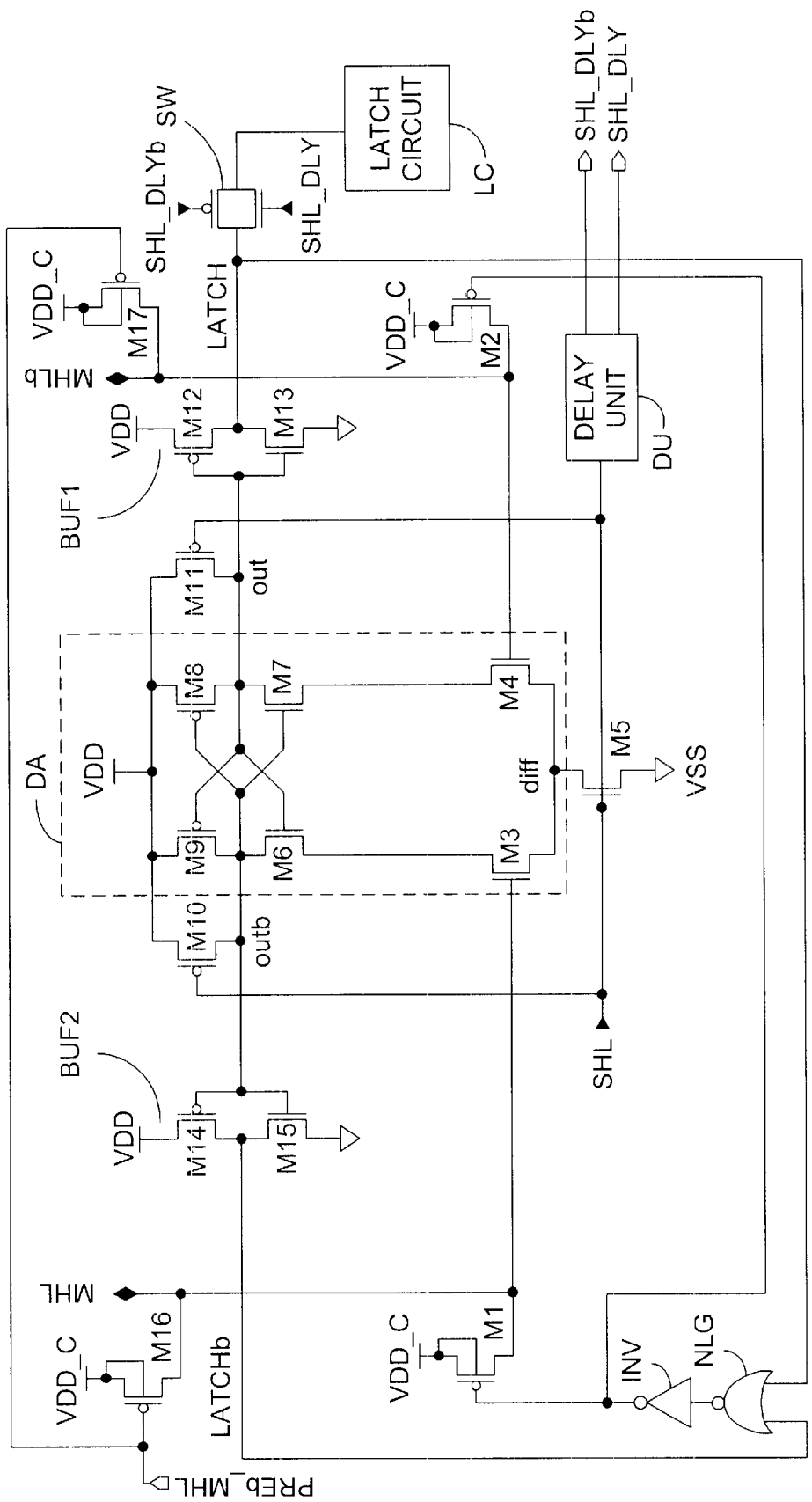
FIG. 5 is a schematic diagram illustrating a differential application and associated circuits for use with the structure shown in FIG. 3, in a second embodiment of the present invention.

FIG. 5 shows a differential amplifier and associated circuits used with the structure shown in FIG. 3 as a second embodiment of the present invention wherein separate first and second PMOS precharge devices M16 and M17, respectively are provided in addition to the clamping devices M1 and M2. The differential amplifier circuit consisting of M3, M4 and M6–M9 is the same as that shown in FIG. 4. Another difference between the first and second embodiments is that the pair of voltage clamping devices M1 and M2 have their respective gates controlled by the output of an inverter INV whose input gate is driven by the output of a NOR logic gate NLG. A first input of NLG is connected to the first output signal LATCH provided by the first inverting buffer BUF1 formed by the first pair of buffer devices M12 and M13, and a second input of NLG is connected to the second output signal LATCHb provided by the second inverting buffer BUF2 formed by the second pair of buffer devices M14 and M15. This connection of the gates of the voltage clamping devices M1 and M2 provides self-timing to turn off M1 and M2 as soon as the differential amplifier DA has latched the data and switched from its precharge state. This provides further reduction in power consumption since M1 and M2 are turned on only for a very limited time during the sensing interval.

Yet another difference from the circuit of the first embodiment shown in FIG. 4 is that instead of using the clamping devices M1 and M2 to precharge MHL and MHLb, the precharge devices M16 and M17 are used to precharge the MHL and MHLb lines using the PREb-MHL signal. Therefore, in this second embodiment as shown in FIG. 5, the voltage clamping devices M1 and M2 are used only to provide, the logic levels on MHL and MHLb and not for precharging as used in the first embodiment. If M1 and M2 were used for precharging as in the first embodiment, the transient current required for precharging MHL and MHLb through any PMOS transistor would be larger than the current needed to develop the voltage levels on these two lines, since in the second embodiment, M1 and M2 can be minimum sized transistors. Therefore, if M1 and M2 were used to perform the precharge, their required larger device sizes would result in a larger DC current power dissipation when developing the voltage levels on MHL and MHLb during the active phase. In order to address this larger power dissipation, the second embodiment of FIG. 5 uses the precharge transistors M16 and M17 to perform the precharge more efficiently.

Figure 7:
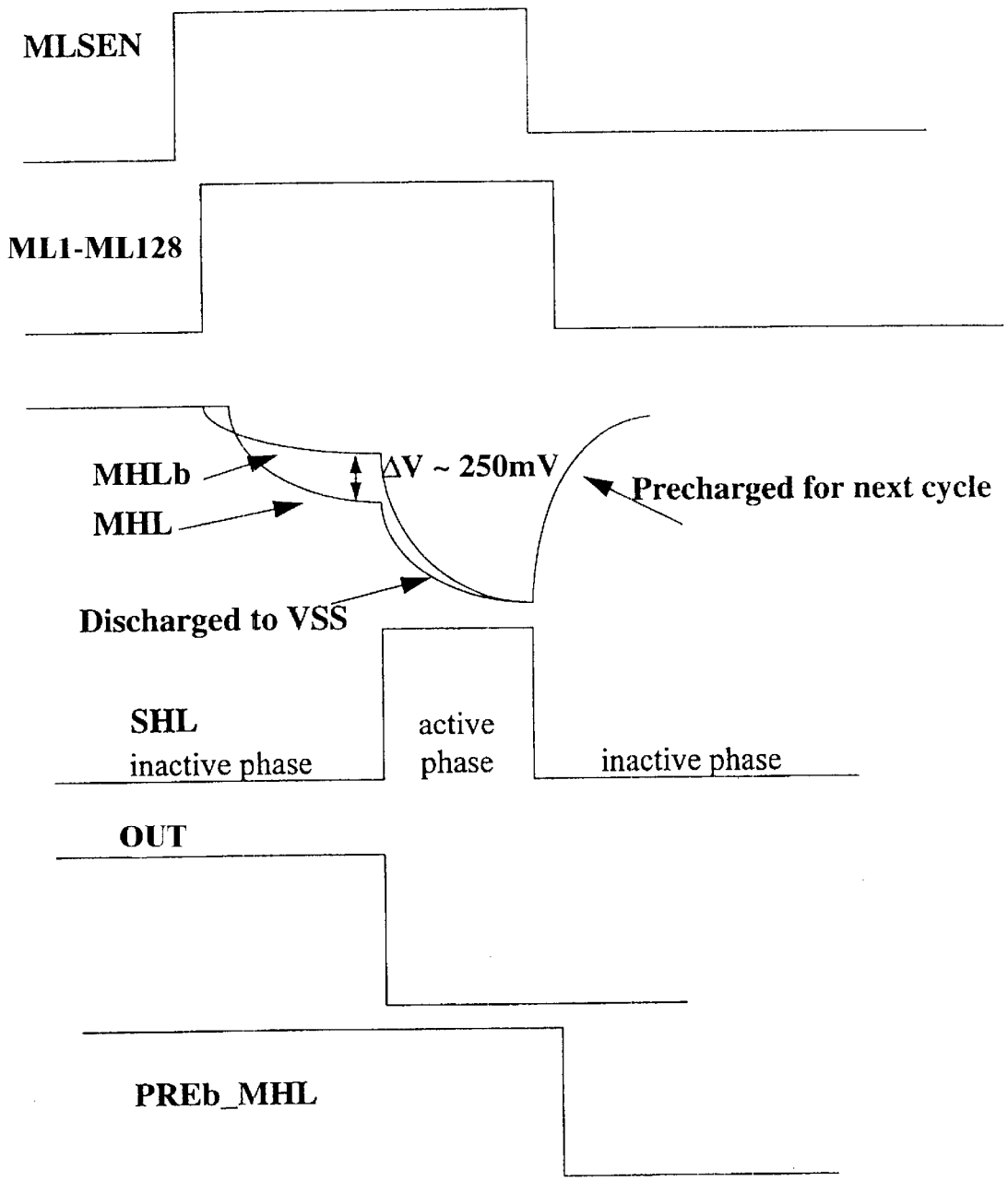
FIG. 7 is a timing diagram of the multiple match detection operation performed by the second embodiment.

FIG. 7 illustrates the detection operation performed by the second embodiment combining the circuits of FIGS. 3 and 5 in the case of a multiple hit. As shown in this figure, as soon as a difference between MHL and MHLb is detected by the differential amplifier DA, both lines begin to be discharged towards VSS by virtue of the feedback circuit from the two amplifier outputs out and outb vial the logic gate NLG and the inverter INV.

Figure 8A:
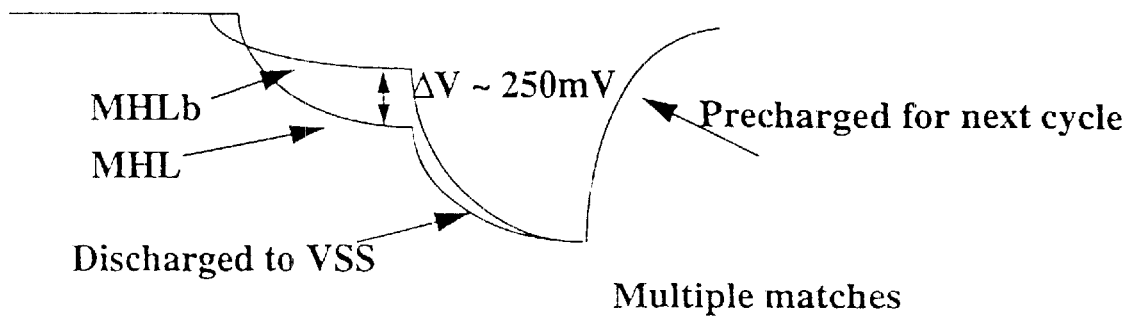
FIGS. 8a, 8b and 8c are timing diagrams to illustrate the three cases of multiple, single and no hit respectively in the second embodiment.
Figure 8B:
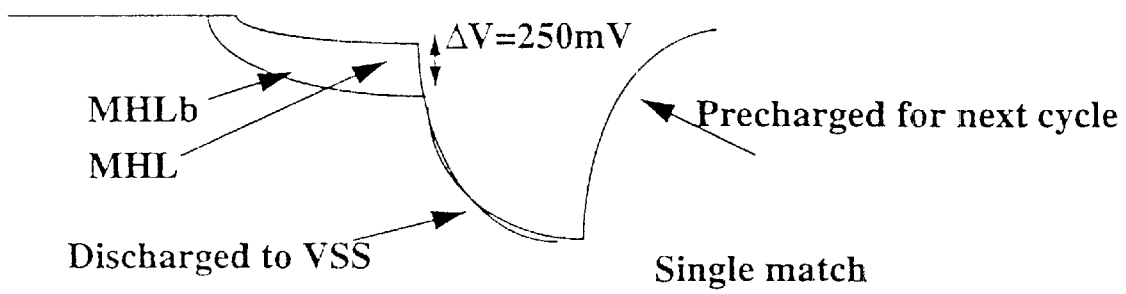
Figure 8C:
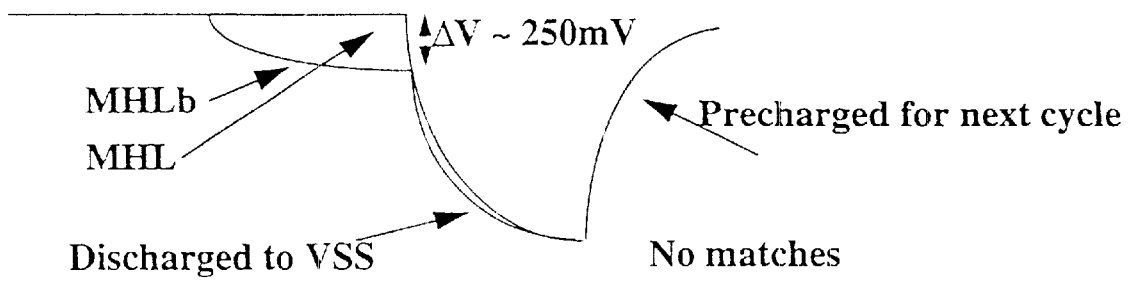

FIGS. 8a, 8b and 8c illustrate the three possible outcomes of the search and compare operation on the circuitry described above for the second embodiment in FIG. 5. FIG. 8a illustrates the case of a multiple hit where the search and compare operation has resulted in more than one hit (or match) between search data and stored data in a particular row of the CAM. Note that after a brief period of time, MHL's voltage level decreases substantially below that of MHLb, as described earlier, due to the combined pull-down action of multiple matchline devices from ML1–ML128 (shown in FIG. 3) being turned on simultaneously. These matchline devices corresponding to the multiple hits have a combined width which is greater than the width of the reference device RD and therefore pull MHL to a voltage level lower than that of MHLb. Detection of the voltage difference between MHL and MHLb occurs once the two lines are sufficiently far apart in voltage to be sensed by the sensing devices M3 and M4. Shortly thereafter, the second output node outb obtains a corresponding signal from the differential amplifier as described above, MHL and MHLb are both discharged to VSS, and then MHL and MHLb are precharged once again in preparation for the next sensing operation during the next active phase. Similarly, in FIG. 8b, the case of a single hit is illustrated. Note that the outcome is opposite to that shown in FIG. 8a, with MHLb being pulled to a voltage level lower than that of MHL since the single matchline transistor that experiences a hit on its associated matchline has a width which is less than that of the reference transistor RD. Finally, in FIG. 8c, the case of no hits is illustrated. Here MHL remains at its precharged state since none of the matchline devices of FIG. 3 are enabled.

As will be understood by those of skill in the art, to detect between a single hit and no hit, there are a set of single hit sense lines HIT_1 to HIT_128 (not shown), similar to MHL_1 to MHL 128, but without sense amplifier comparison. Lines HIT_1 to HIT_128 detect whether there is at least one match. Simple logic is then implemented to process the outputs from the single hit lines and the multiple hit lines, MHL, to determine if a single, multiple or no hit has occured.

Of course, numerous variations and adaptations may be made to the particular embodiments of the invention described above, without departing from the spirit and scope of the invention, which is defined solely in the claims. Whereas the embodiments described above are particularly relevant to high density CAM arrays requiring detection of multiple hits, the invention is also applicable to the detection of data lines having a time varying voltage level with no pre-set reference.

What is claimed is:

1. A method for detecting n match conditions within a CAM array, comprising the steps of:

precharging a sense node and a reference node of a differential amplifier in an inactive state to a supply voltage level;

changing a voltage level of the reference node to a reference voltage level in a predetermined voltage range by turning on a reference device;

changing a voltage level of the sense node to a sensed voltage level dependent on a number of match condition signals by turning on a corresponding number of matchline devices coupled in parallel to the sense node;

comparing the reference voltage level to the sensed voltage level by switching the differential amplifier to an active state; and, providing an output signal from the differential amplifier corresponding to the result of the comparison.

2. The method for detecting n match conditions of claim 1, wherein the reference node voltage level and the sense node voltage level start changing from the supply voltage level at about the same time.

3. The method for detecting match conditions of claim 2, wherein the differential amplifier is switched to the active state at a predetermined time delay after the reference node voltage level and the sense node voltage level start changing.

4. The method for detecting n match conditions of claim 1, further including the step of switching the differential amplifier to the inactive state when the output signal is provided.

5. The method for detecting n match conditions of claim 1, further including the step of latching the output signal.

6. The method for detecting n match conditions of claim 1, wherein the predetermined voltage range is between a voltage level corresponding to n match condition signals and n−1 match condition signals.

* * * * *